(12) United States Patent
Miyajima et al.

(10) Patent No.: US 8,660,158 B2
(45) Date of Patent: Feb. 25, 2014

(54) SEMICONDUCTOR LASER DRIVE CIRCUIT AND SEMICONDUCTOR LASER APPARATUS

(75) Inventors: Yoshifumi Miyajima, Nagasaki (JP); Katsuya Nakashima, Nagasaki (JP)

(73) Assignee: Sony Corporation, Tokyo (JP)

( * ) Notice: Subject to any disclaimer, the term of this patent is extended or adjusted under 35 U.S.C. 154(b) by 44 days.

(21) Appl. No.: 13/470,907

(22) Filed: May 14, 2012

(65) Prior Publication Data

US 2012/0294324 A1    Nov. 22, 2012

(30) Foreign Application Priority Data

May 18, 2011    (JP) ................................ 2011-111159

(51) Int. Cl.
*H01S 3/00*    (2006.01)
(52) U.S. Cl.
USPC ....................................................... 372/38.02
(58) Field of Classification Search
USPC ................. 372/38.01, 50.124, 38.02
See application file for complete search history.

(56) References Cited

U.S. PATENT DOCUMENTS 7,233,165 B2 *   6/2007  Jordy ............................... 326/29
7,764,122 B1 *   7/2010  Dasgupta ....................... 330/255

FOREIGN PATENT DOCUMENTS

JP    2003-243766    8/2003

* cited by examiner

*Primary Examiner* — Jessica Stultz
*Assistant Examiner* — Tuan Nguyen
(74) *Attorney, Agent, or Firm* — Rader, Fishman & Grauer PLLC

(57) ABSTRACT

A semiconductor laser drive circuit controlling a semiconductor laser diode connected to an output terminal by providing a drive electric current to the semiconductor laser diode includes: a constant electric current source configured to provide an electric current to the output terminal, the constant electric current source being connected to a first electric power terminal and the output terminal; a current sinking circuit connected to the output terminal and a second electric power terminal; a current sourcing circuit configured to provide a predetermined electric current to the output terminal or the current sinking circuit, the current sourcing circuit being connected to the first electric power terminal and the output terminal; and a terminating resistor having a resistance component equal to that of the semiconductor laser diode, the terminating resistor being connected to the circuit sinking circuit and the current sourcing circuit.

7 Claims, 13 Drawing Sheets

FIG.2
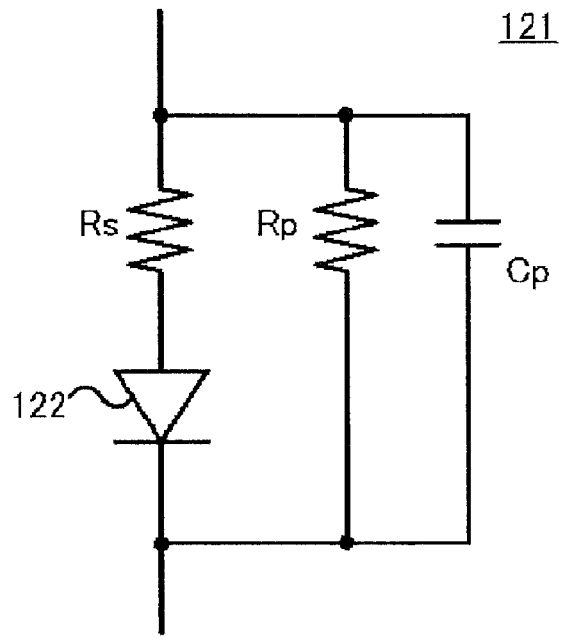
FIG.2A
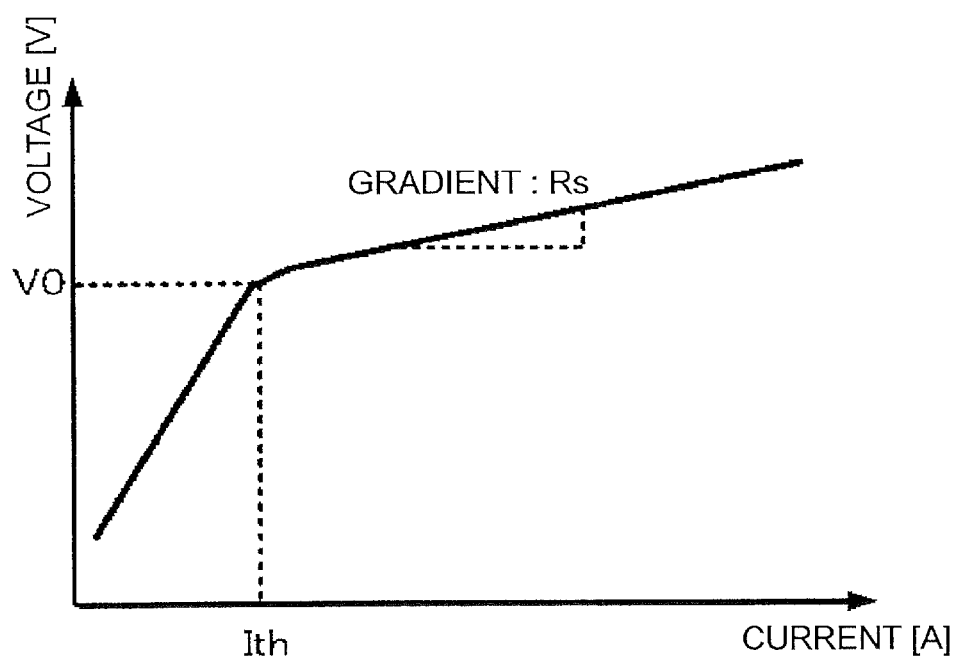
FIG.2B

FIG.7
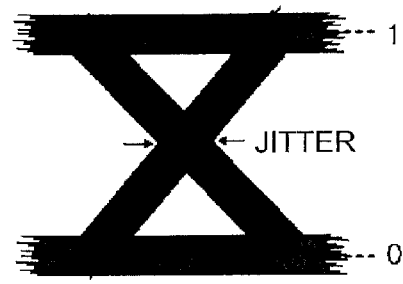
FIG.7A
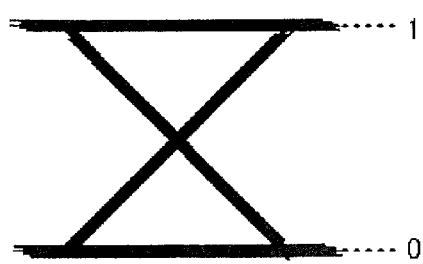
FIG.7B

SEMICONDUCTOR LASER DRIVE CIRCUIT AND SEMICONDUCTOR LASER APPARATUS

BACKGROUND

The present disclosure relates to a semiconductor laser drive circuit and a semiconductor laser apparatus.

Recently, an increase in speed of optical communication has been proceeding quickly and Gb/s optical communication systems are put into use. Semiconductor laser diodes such as VCSELs (Vertical Cavity Surface Emitting Lasers) are used as light sources of short wavelength optical transceiver for high speed optical communication systems.

The semiconductor laser diodes are controlled by semiconductor laser drive circuits. With transmission lines, the semiconductor laser diodes are coupled to the semiconductor laser drive circuits because they are manufactured so that each of the semiconductor laser diodes and the associated one of the semiconductor laser drive circuits are made as different semiconductor ICs, respectively.

Impedance matching is achieved between the semiconductor laser diode and its drive circuit in order to carry a driving signal from the drive circuit to the semiconductor laser diode with low power loss and reflection. As mentioned above, the transmission line is used to couple the semiconductor laser diode and its drive circuit together. Therefore, impedance matching between the transmission line and the drive circuit is achieved in order to carry a driving signal from the drive circuit to the semiconductor laser diode with low power loss and reflection.

Among various approaches to impedance matching, for example, there is an approach by providing a terminating resistor for connection to the semiconductor laser drive circuit and there is another approach by providing a damping resistor as disclosed in Japanese Patent Application Laid-open No. 2003-243766.

SUMMARY

According to the above-mentioned Japanese Patent Application Laid-open No. 2003-243766, there is a problem of an increase in the number of parts due to the provision of a new damping resistor. Further, there is a problem that the difficulty in mounting parts gets higher due mainly to the increased number of parts.

When the terminating resistor is used for impedance matching, there is a problem that the level of jitter deteriorates due mainly to variations in the DC level of a driving signal caused by variations in terminating potential.

In view of the above-mentioned problems, it is desirable to provide a semiconductor laser drive circuit and a semiconductor laser apparatus, which, with simple construction, suppress variations in terminating potential while achieving impedance matching.

According to an embodiment of the present disclosure, there is provided a semiconductor laser drive circuit controlling a semiconductor laser diode connected to an output terminal by providing a drive electric current to the semiconductor laser diode, including: a constant electric current source configured to provide an electric current to the output terminal, the constant electric current source being connected at one end to a first electric power terminal and connected at the other end to the output terminal; a current sinking circuit connected at one end to the output terminal and connected at the other end to a second electric power terminal; a current sourcing circuit configured to provide a predetermined electric current to one of the output terminal and the current sinking circuit, the current sourcing circuit being connected at one end to the first electric power terminal and connected at the other end to the output terminal; and a terminating resistor having a resistance component equal to a resistance component of the semiconductor laser diode, the terminating resistor being connected at one end to the one end of the circuit sinking circuit and connected at the other end to the other end of the current sourcing circuit.

According to another embodiment of the present disclosure, there is provided a semiconductor laser drive circuit controlling a semiconductor laser diode connected to an output terminal by providing a drive electric current to the semiconductor laser diode, including: a constant electric current source configured to provide an electric current to the output terminal, the constant electric current source being connected at one end to a first electric power terminal and connected at the other end to the output terminal; a current sourcing circuit connected at one end to the first electric power terminal and connected at the other end to the output terminal; a current sinking circuit configured to sink an electric current provided from one of the constant electric constant source and the current sourcing circuit, the current sinking circuit being connected at one end to the output terminal and connected at the other end to a second electric power terminal; and a terminating resistor having a resistance component equal to a resistance component of the semiconductor laser diode, the terminating resistor being connected at one end to the one end of the circuit sinking circuit and connected at the other end to the other end of the current sourcing circuit.

According to another embodiment of the present disclosure, there is provided a semiconductor laser apparatus including the above-mentioned semiconductor laser drive circuit and semiconductor laser diode.

According to the present disclosure, with simple construction, variations in terminating potential are suppressed while achieving impedance matching.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 2 are diagrams illustrating a semiconductor laser diode according to the first embodiment;

FIG. 7 are diagrams illustrating the DC level of current signals through the semiconductor laser drive circuit according to the first embodiment;

DETAILED DESCRIPTION OF EMBODIMENTS

First Embodiment

Figure 1:
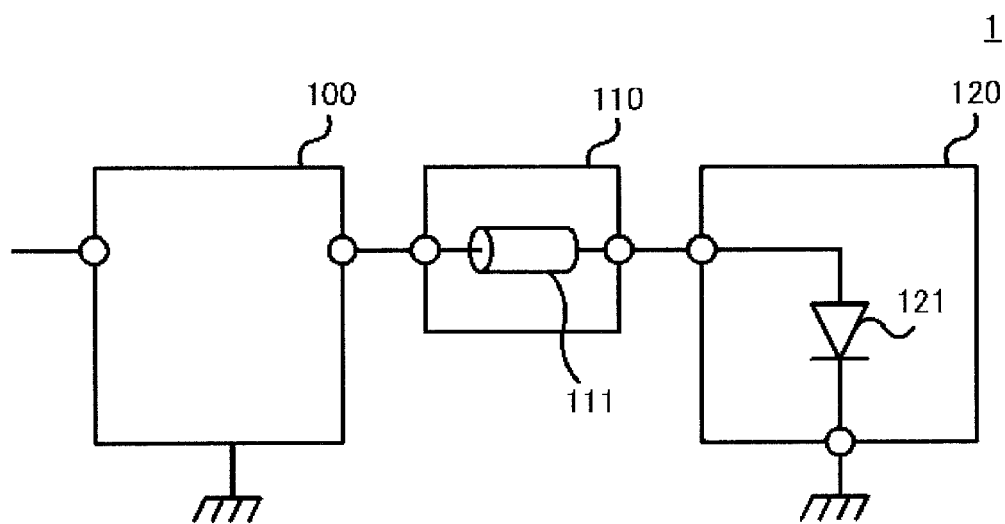
FIG. 1 is a diagram illustrating a semiconductor laser apparatus according to a first embodiment.

FIG. 1 is a diagram illustrating a semiconductor laser apparatus 1 according to a first embodiment. The semiconductor laser apparatus 1 includes a semiconductor laser circuit 120 having a semiconductor laser diode 121, and a semiconductor laser drive circuit 100 driving the semiconductor laser circuit 120. According to this embodiment, the semiconductor laser drive circuit 100 and the semiconductor laser circuit 120 are installed on different semiconductor ICs. In addition, the semiconductor laser drive circuit 100 and the semiconductor laser circuit 120 may be installed on the same semiconductor IC.

The semiconductor laser apparatus 1 includes a transmission line 111 coupled between the semiconductor laser drive circuit 100 and the semiconductor laser circuit 120. The transmission line 111 is formed on a printed circuit board 110. The transmission line 111 has characteristic impedance of 50 Ohm.

FIG. 2A is a diagram illustrating an equivalent circuit for the semiconductor laser diode 121. As illustrated in FIG. 2A, the semiconductor laser diode 121 is represented by a diode device 122, a differential resistor Rs connected in series with the diode device 122, an internal resistor Rp, and an internal capacitor Cp. The series connection formed by the diode device 122 and differential resistor Rs, the internal resistor Rp, and the internal capacitor Cp are connected in parallel. In concrete terms, the differential resistor Rs is connected at one end to one end of the diode device 122. The internal resistor Rp is connected at one end to the other end of the differential resistor Rs and connected at the other end to the other end of the diode device 122. The internal capacitor Cp is connected at one end to the other end of the differential resistor Rs and connected at the other end to the other end of the diode device 122.

FIG. 2B is a diagram illustrating an I-V curve of the semiconductor laser diode 121. In the region where electric current flowing through the semiconductor laser diode 121 is above or equal to a lasing threshold Ith, the I-V curve is represented by a straight line with a gradient of approximately Rs and follows Ohm's law. The gradient Rs is equal to the resistance of the above-mentioned differential resistor Rs.

Figure 3:
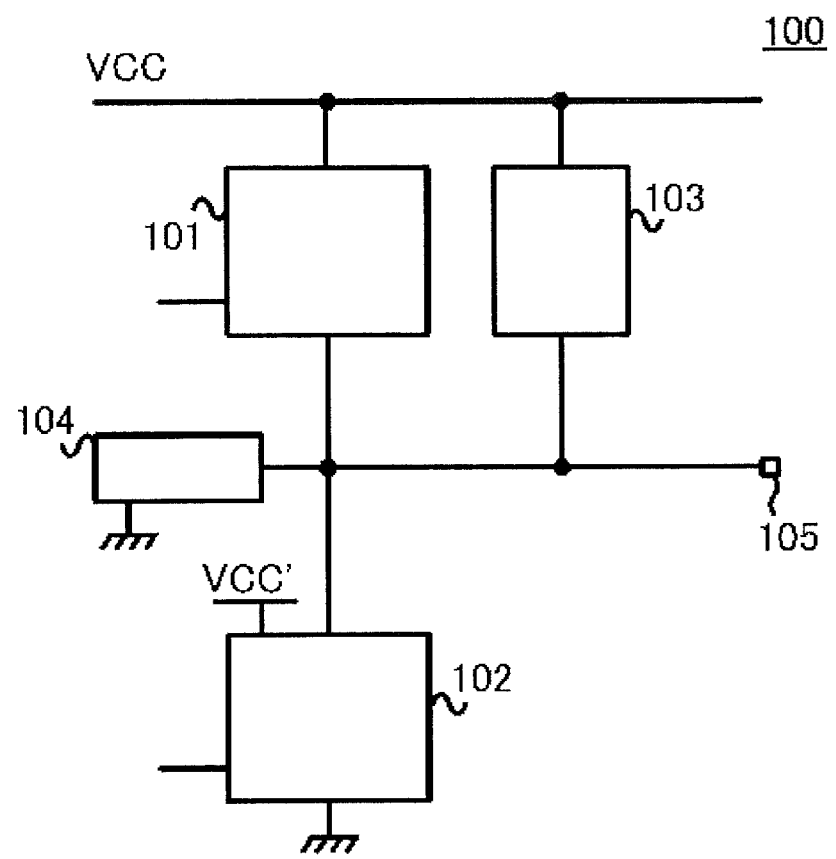
FIG. 3 is a diagram illustrating a semiconductor laser drive circuit according to the first embodiment.

FIG. 3 is a diagram illustrating the semiconductor laser drive circuit 100. The semiconductor laser drive circuit 100 includes a current sourcing circuit 101 connected at one end to a first electric power potential (Vcc in FIG. 3) and connected at the other end to an output terminal 105, a current sinking circuit 102 connected at one end to the output terminal 105 and connected at the other end to a second electric power terminal (GND in FIG. 3), a constant current source 103 connected at one end to the first electric power potential and connected at the other end to the output terminal 105, and a terminating resistor 104 connected at one end to the output terminal 105 and connected at the other end to the second electric power terminal.

The constant current source 103 provides a current signal to the output terminal 105. The current sourcing circuit 101 steers a predetermined current signal to one of the output terminal 105 and the current sinking circuit 102 in response to control signals from a higher layer not illustrated.

Figure 4:
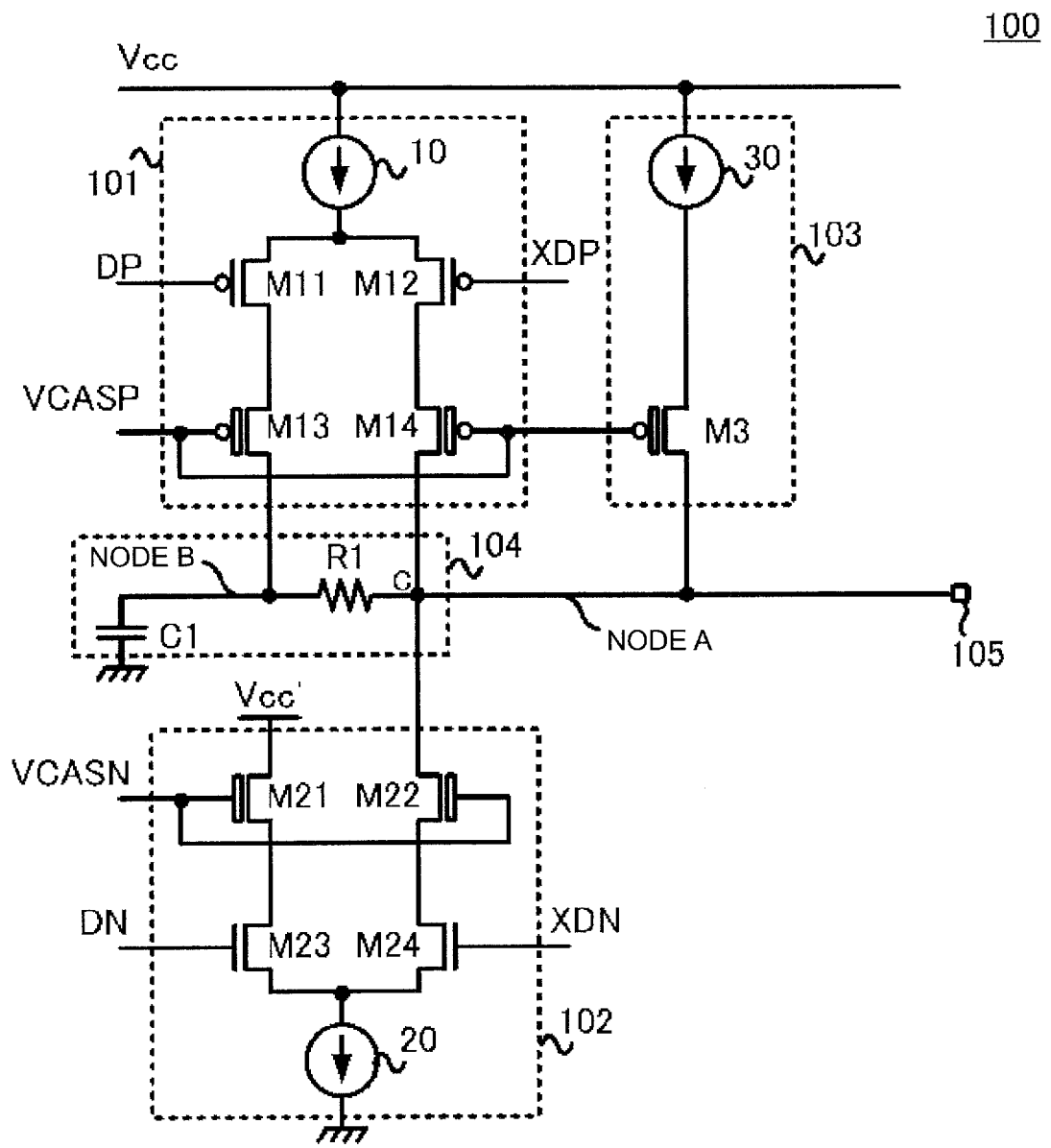
FIG. 4 is a circuit diagram illustrating the semiconductor laser drive circuit according to the first embodiment.

Referring to FIG. 4, details of the semiconductor laser drive circuit 100 are described. The current sourcing circuit 101 has a first electric current source 10, first conductivity type transistors M11 and M12, and high blocking voltage first conductivity type transistors M13 and M14. In addition, in the present embodiment, the first conductivity type transistors are explained as PMOS transistors.

The first electric current source 10 is connected at one end to Vcc and provides a constant electric current Im to the PMOS transistors M11 and M12. The PMOS transistor M11 is connected at its source to the other end of the first electric current source 10 and connected at its drain to a source of the high blocking voltage PMOS transistor M13. Input to a gate of the PMOS transistor M11 is a control signal DP from an upper layer not illustrated. The PMOS transistor M12 is connected at its source to the other end of the first electric current source 10 and connected at its drain to a source of the high blocking voltage PMOS transistor M14. Input to a gate of the PMOS transistor M14 is a control signal XDP from the upper layer not illustrated.

The high blocking voltage PMOS transistor M13 is connected at its drain to one end of a resistance element R1 of the terminating resistor 104 later described. The high blocking voltage PMOS transistor M14 is connected at its drain to the other end of the resistance element R1 and the output terminal 105. In addition, the high blocking voltage PMOS transistors M13 and M14 are transistors for protecting low blocking voltage transistors like the PMOS transistors M11 and M12 and transistors constituting the first electric current source 10. In order to prevent application of high voltage to these low blocking voltage transistors, a control signal VCASP is input to gates of the high blocking voltage PMOS transistors M13 and M14.

The PMOS transistor M11 and the PMOS transistor M12 operate complementarily. This allows a current signal Im from the first electric current source 10 to be steered to one of the PMOS transistor M11 and the PMOS transistor M12. Details of operation of each transistor are described later.

In addition, the one end of the current sourcing circuit 101 shown in FIG. 3 corresponds to the one end of the first electric current source 10, and the other end thereof corresponds to the drain of the high blocking voltage PMOS transistor M14. Similarly to the drain of the high blocking voltage PMOS transistor M14, the drain of the high blocking voltage PMOS transistor M13 is also connected to the terminating resistor 104. The drain of the high blocking voltage PMOS transistor M13 is named a third terminal of the current sourcing circuit 101.

The current sinking circuit 102 has a second electric current source 20, high blocking voltage second conductivity type transistors M21 and M22 and second conductivity type transistors M23 and M24. In addition, in the present embodiment, the second conductivity type transistors are explained as NMOS transistors.

The second electric current source 20 is coupled at one end to ground GND. There is the flow of a constant electric current Im in the second electric current source 20. The high blocking voltage NMOS transistor M21 is connected at its drain to a third electric power potential (Vcc' in FIG. 4) and connected at its source to a drain of the NMOS transistor M23. The high blocking voltage NMOS transistor M22 is connected at its drain to the output terminal 105 and the other end of the current sourcing circuit 101 and connected at its source to a drain of the NMOS transistor M24. In addition, the high blocking voltage NMOS transistors M21 and M22 are transistors for protecting low blocking voltage transistors like the NMOS transistors M23 and M24 and transistors constituting the second electric current source 20. In order to prevent application of a high voltage to these low blocking voltage transistors, a control signal VCASN is input to gates of the high blocking voltage NMOS transistors M21 and M22.

The NMOS transistors M23 and M24 are connected at their sources to the other end of the second electric current source 20. Control signals DN and XDN from the upper layer not illustrated are input to gates of the NMOS transistors M23 and M24, respectively. The NMOS transistors M23 and M24 operate complementarily. This allows a current signal Im to flow to the second current source 20 from one of the NMOS transistors M23 and M24. Details of operation of each transistor are described later.

The constant electric current source 103 includes a third electric current source 30 and a high blocking voltage first conductivity type (PMOS) transistor M3. The third electric current source 30 is connected at one end to Vcc and connected at the other end to a source of the high blocking voltage PMOS transistor M3. The third electric current source 30 provides a current signal Ic to the output terminal 105. The high blocking voltage PMOS transistor M3 is connected at its drain to the output terminal 105. The high blocking voltage PMOS transistor M3 is a transistor for protecting a low blocking voltage transistor like a transistor constituting the third electric current source 30. In order to prevent application of a high voltage to this low blocking voltage transistor, a control signal VCASP is input to a gate of the high blocking voltage PMOS transistor M3.

The terminating resistor 104 has the resistance element R1 and a capacitance element C1. The resistance element R1 is connected at one end to the output terminal 105 and connected at the other end to the drain of the high blocking voltage PMOS transistor M13. The capacitance element C1 is connected at one end to the other end of the resistance element R1 and coupled at the other end to ground GND. The resistance element R1 and the capacitance element C1 constitute a snubber type terminating resistor. Characteristic impedances of the resistance element R1 and capacitance element C1 are determined to have such values as to achieve impedance matching between the semiconductor laser drive circuit 100 and the transmission line 111. A resistance component of the terminating resistor 104 is determined to be equal to the resistance component of the semiconductor laser diode 121. In concrete terms, the resistance of the resistance element R1 is set to be equal to the resistance of the differential resistor Rs of the semiconductor laser diode 121 (R1=Rs).

Figure 5:
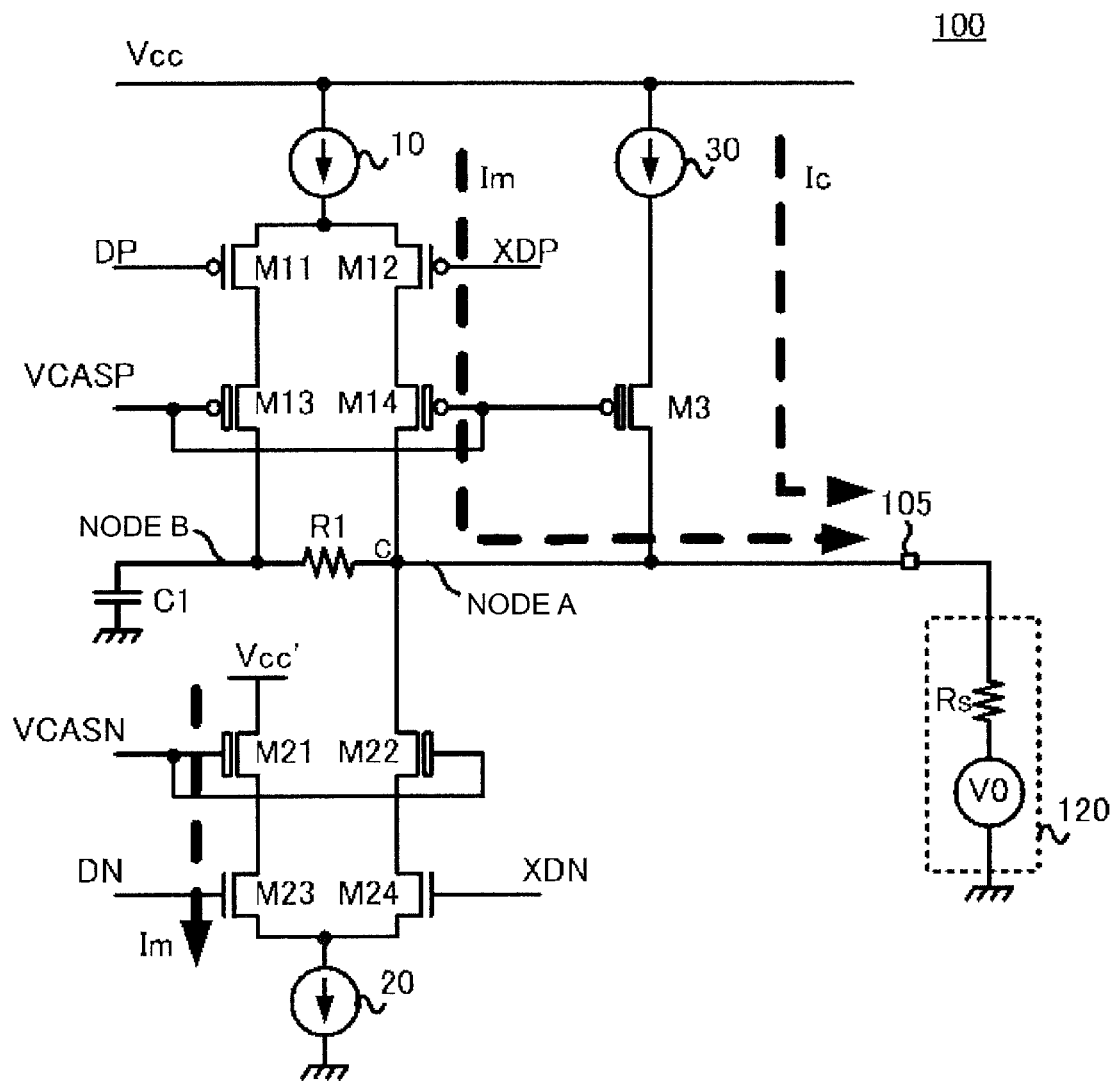
FIG. 5 is a diagram illustrating current signals flowing through the semiconductor laser drive circuit according to the first embodiment.
Figure 6:
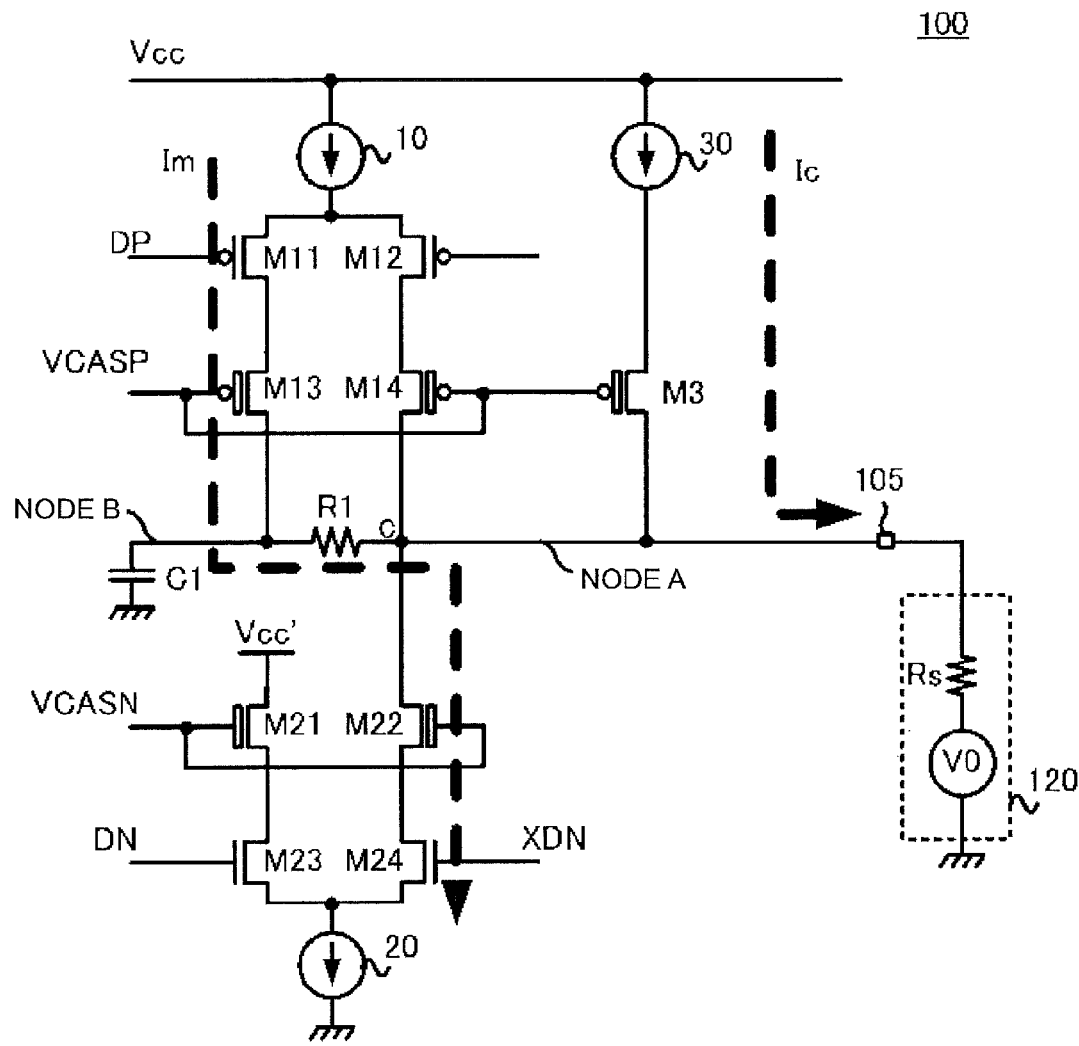
FIG. 6 is a diagram illustrating current signals flowing through the semiconductor laser drive circuit according to the first embodiment.

Next, FIGS. 5 and 6 are used to explain the operation of the semiconductor laser drive circuit 100. The present embodiment is explained the case where the semiconductor laser apparatus 1 acts as a binary transmitter that transmits either a High signal indicating data "1" or a Low signal indicating data "0".

First of all, it is explained how the semiconductor laser apparatus 1 operates when it outputs a High signal indicating data "1" from the semiconductor laser circuit 120. In this case, control signals are input to the semiconductor laser drive circuit 100 from the upper layer not illustrated such that the PMOS transistor M11 and the NMOS transistor M24 are turned off, and the PMOS transistor M12 and the NMOS transistor M23 are turned on.

In FIG. 5, there is illustrated how current signals flow when the PMOS transistor M11 and the NMOS transistor M24 are turned off and the PMOS transistor M12 and the NMOS transistor M23 are turned on. Since the PMOS transistor M11 is turned off and the PMOS transistor M12 is turned on, the current signal Im from the first electric current source 10 flows to a point of contact C where the drain of the high blocking voltage PMOS transistor M14 and the one end of the resistance element R1 are connected to each other by way of the PMOS transistor M12 and the high blocking voltage PMOS transistor M14. Since the NMOS transistor M24 is turned off, the current signal Im that has flown to the point of contact C flows to the output terminal 105. Fed to the output terminal 105 is a current signal Ic from the third electric current source 30 of the constant electric current source 103. As a result, a current signal Im+Ic is fed from the output terminal 105 to the semiconductor laser circuit 120. The semiconductor laser circuit 120 outputs a High signal corresponding to the current signals Im+Ic.

Since the NMOS transistor M23 is turned on and the NMOS transistor M24 is turned off, the second electric current source 20 of the current sinking circuit 102 operate to provide a current signal Im to flow via the NMOS transistor M23.

Consider now a potential difference between both ends of the semiconductor laser circuit 120. As shown in FIG. 5, the potential difference between the both ends of the semiconductor laser circuit 120 is determined by a current-independent voltage V0 and a potential difference between both ends of the differential resistor Rs. The potential difference between the both ends of the differential resistor Rs is given by (Im+Ic)×Rs because the current signals Im+Ic flows through the differential resistor Rs. As a result, the potential difference between the both ends of the semiconductor laser circuit 120 is given by (Im+Ic)×Rs+V0.

Potential at a node A connected to the output terminal 105 of FIG. 5 and potential at a node B between the resistance element R1 and the capacitance element C1 are each equal to the potential difference between the both ends of the semiconductor laser circuit 120, (Im+Ic)×Rs+V0.

Next, it is explained how the semiconductor laser apparatus 1 operates when it outputs a Low signal indicating data "0" from the semiconductor laser circuit 120. In this case, control signals are input to the semiconductor laser drive circuit 100 from the upper layer not illustrated such that the PMOS transistor M11 and the NMOS transistor M24 are turned on, and the PMOS transistor M12 and the NMOS transistor M23 are turned off.

In FIG. 6, there is illustrated how current signals flow when the PMOS transistor M11 and the NMOS transistor M24 are turned on and the PMOS transistor M12 and the NMOS transistor M23 are turned off. Since the PMOS transistor M11 is turned on and the PMOS transistor M12 is turned off, the current signal Im from the first electric current source 10 flows to the point of contact C by way of the PMOS transistor M11 and the resistance element R1. Since the NMOS transistor M24 is turned on, the current signal Im that has flown to the point of contact C flows to the second electric current source 20 by way of the NMOS transistor M22. Fed to the output terminal 105 is the current signal Ic from the third electric current source 30 of the constant electric current source 103. As a result, the current signal Ic is fed from the output terminal 105 to the semiconductor laser circuit 120.

The semiconductor laser circuit 120 outputs a Low signal corresponding to the current signal Ic.

Consider now a potential difference between the both ends of the semiconductor laser circuit 120. The potential difference between the both ends of the semiconductor laser circuit 120 is given by Ic×Rs+V0 because the current signal Ic is fed to the semiconductor laser circuit 120. Potential at the node A is equal to the potential difference between the both ends of the semiconductor laser circuit 120, Ic×Rs+V0.

Next, consider potential at the node B. A potential difference between the both ends of the resistance element R1 is given by R1×Im because the current signal Im flows through the resistance element R1. As a result, the potential at the node B is given by (Ic×Rs+V0)+(R1×Im). Assuming here that R1=Rs, obtained is (Ic×Rs+V0)+(Rs×Im)=(Im+Ic)×Rs+V0 as the potential at the node B.

By nearly equalizing the resistance of the resistance element R1 of the terminating resistor 104 to the resistance of the differential resistor Rs of the semiconductor laser circuit 120 in this way, the terminating potential (the potential at the node B) of the terminating resistor 104 can remain nearly constant in either case where the semiconductor laser apparatus 1 outputs a High signal or where it outputs a Low signal.

Using FIG. 7, there is explained the relation between the DC level of terminating potential and the DC level of current signal. When the semiconductor laser apparatus 1 outputs a High signal indicating data "1", the semiconductor laser drive circuit 100 generates a current signal Im+Ic having a high DC level. On the other hand, when the semiconductor laser apparatus 1 outputs a Low signal indicating data "0", the semiconductor laser drive circuit 100 generates a current signal Ic having a low DC level.

FIG. 7A is a diagram illustrating variations in DC level of a current signal when the terminating potential fluctuates greatly. When the terminating potential fluctuates greatly, the DC level of a current signal also fluctuates greatly. This results in jitter deterioration, causing waveform distortion of an output signal of the semiconductor laser apparatus 1. FIG. 7B is a diagram illustrating variations in DC level of a current signal when the terminating potential remains nearly constant like the present embodiment. According to the present embodiment, variations in DC level of a current signal can be suppressed by holding the terminating potential nearly constant and levels of jitter can be improved. This lowers distortion in waveform of an output signal of the semiconductor laser apparatus 1.

In the semiconductor laser drive circuit 100 of the semiconductor laser apparatus 1 according to the present embodiment, the current sourcing circuit 101 steers a current signal Im to the output terminal 105 when outputting a High signal and the current sourcing circuit 101 steers a current signal Im to the current sinking circuit 102 when outputting a low signal as previously described. This can hold terminating potential of the terminating resistor 104 nearly constant. In this way, the semiconductor laser drive circuit 100 can suppress variations in DC level by holding terminating potential nearly constant while achieving impedance matching with such a simple construction of the terminating resistor 104, to thereby improve levels of jitter.

It is explained in the previous description that the resistance of the resistance element R1 of the terminating resistor 104 is equal to the resistance of the differential resistor Rs of the semiconductor laser diode 121, but that is not necessarily the case. The resistance of the resistance element R1 does not necessarily coincide with that of the differential resistor Rs, and may deviate from that of the differential resistor Rs by a deviation of about 5 percent. More the resistance of the resistance element R1 approaches the resistance of the differential resistor Rs, the less the terminating potential fluctuates. This suppresses variations in DC level, making it possible to improve levels of jitter.

Modification 1

Figure 8:
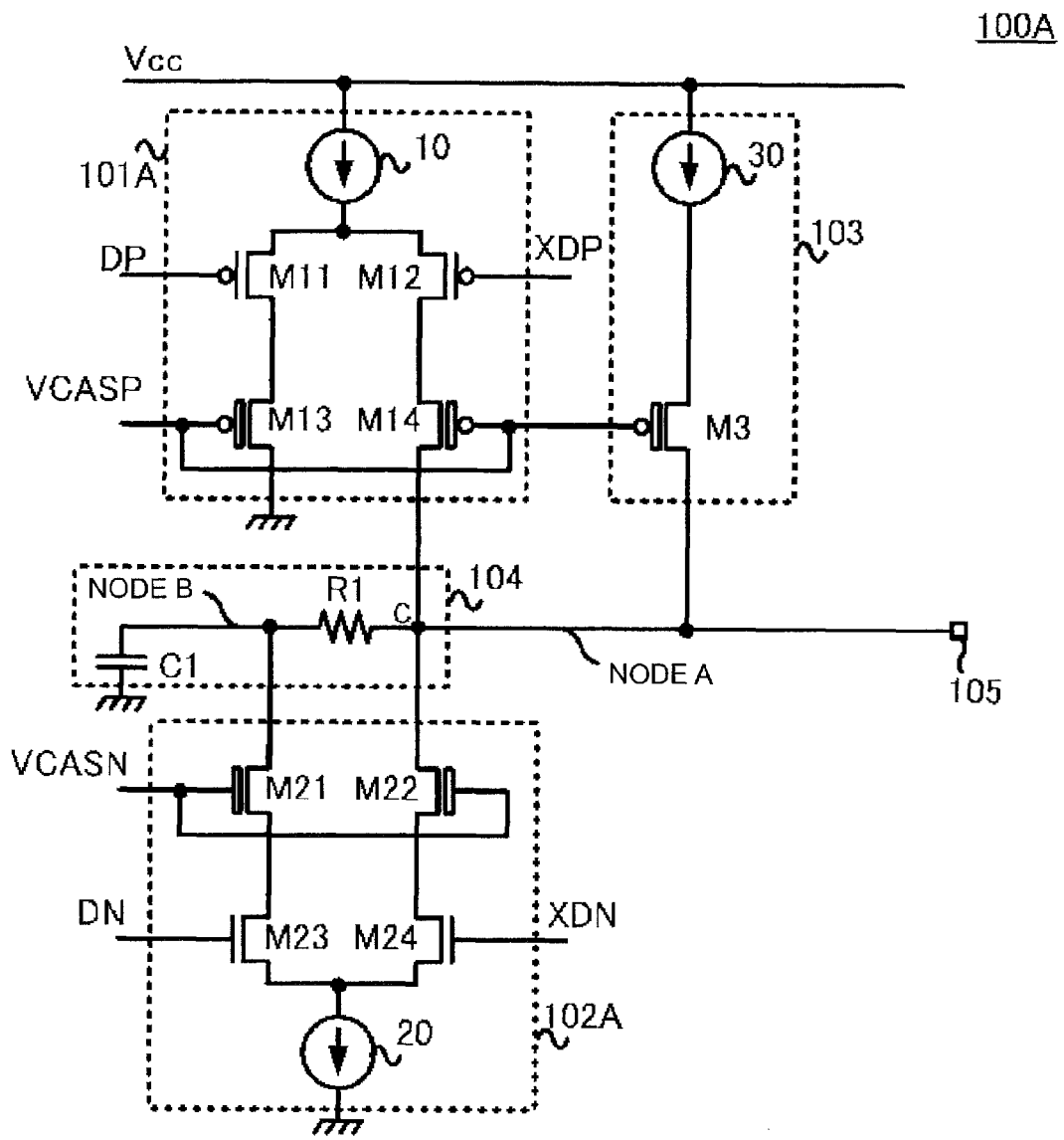
FIG. 8 is a diagram illustrating a semiconductor laser drive circuit according to Modification 1 of the first embodiment.

Next, FIG. 8 is used to explain Modification 1 of the semiconductor laser drive circuit 100 according to the present embodiment. A semiconductor laser drive circuit 100A according to this modification is different from the semiconductor laser drive circuit 100 in that a high blocking voltage NMOS transistor M21 is connected at its drain to the other end of a resistance element R1. Explanation is omitted by using like reference numerals for the semiconductor laser drive circuit 100 according to the present first embodiment to refer to identical constituent elements.

A high blocking voltage PMOS transistor M13 of a current sourcing circuit 101A is coupled at its drain to ground GND. In addition, a high blocking voltage NMOS transistor M21 of a current sinking circuit 102A is connected at its drain to the other end of a resistance element R1 of a terminating resistor 104.

Figure 9:
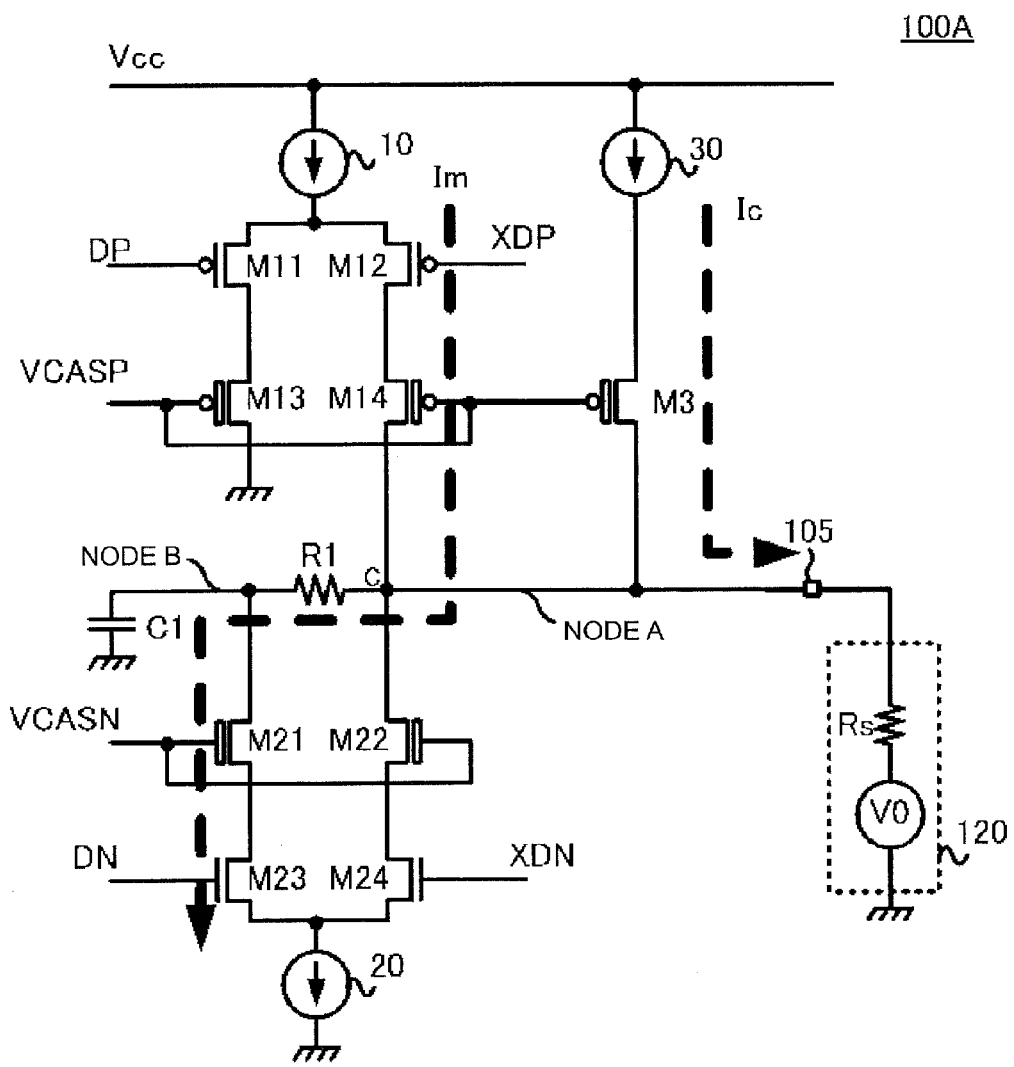
FIG. 9 is a diagram illustrating current signals flowing through the semiconductor laser drive circuit according to Modification 1 of the first embodiment.
Figure 10:
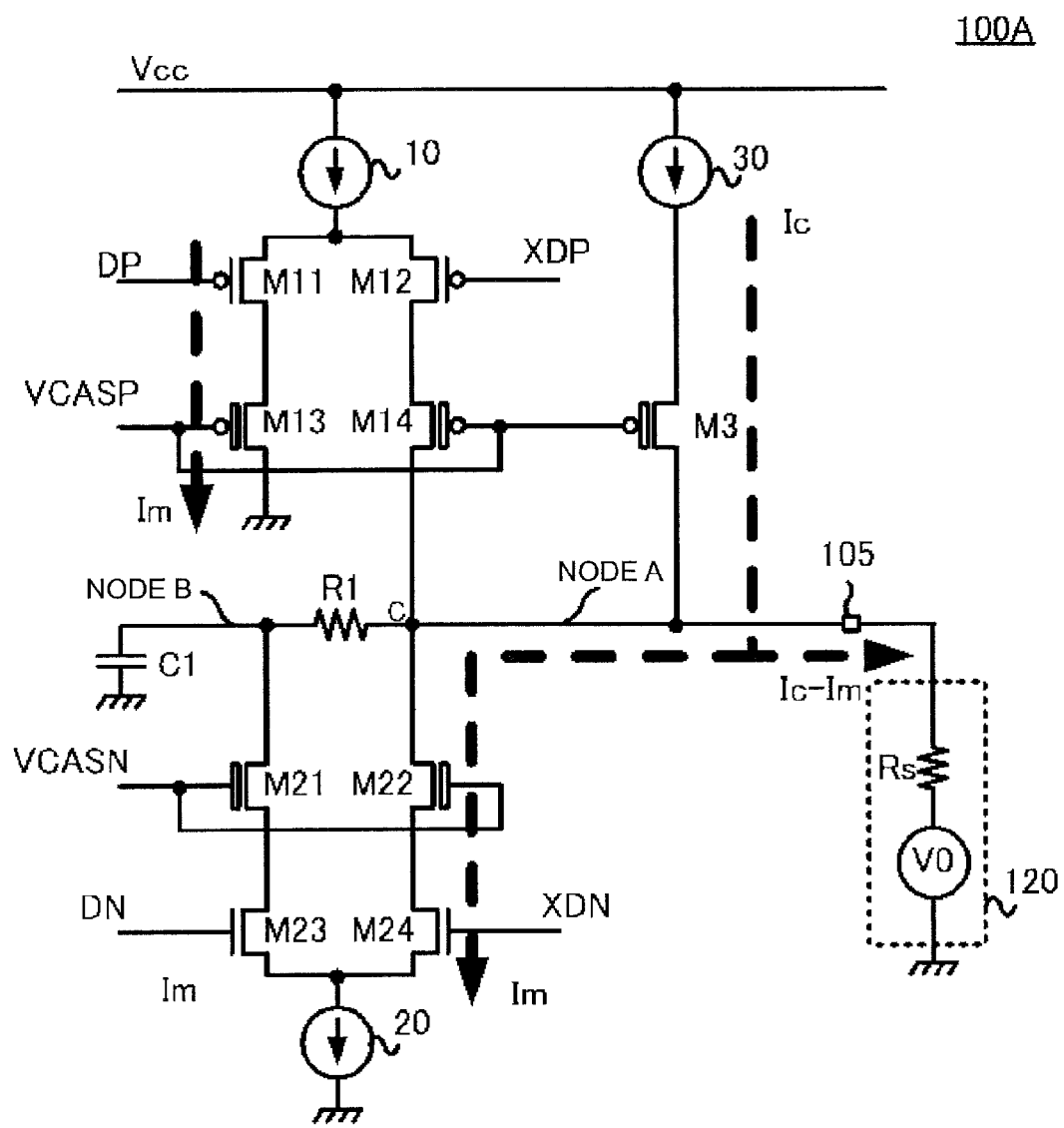
FIG. 10 is a diagram illustrating current signals flowing through the semiconductor laser drive circuit according to Modification 1 of the first embodiment.

Next, FIGS. 9 and 10 are used to explain operation of the semiconductor laser drive circuit 100A. First of all, it is explained how the semiconductor laser apparatus 1 operates when it outputs a High signal indicating data "1" from the semiconductor laser circuit 120. In this case, control signals are input to the semiconductor laser drive circuit 100A from an upper layer not illustrated such that a PMOS transistor M11 and an NMOS transistor M24 are turned off, and a PMOS transistor M12 and an NMOS transistor M23 are turned on.

In FIG. 9, there is illustrated how current signals flow when the PMOS transistor M11 and the NMOS transistor M24 are turned off and the PMOS transistor M12 and the NMOS transistor M23 are turned on. Since the PMOS transistor M11 is turned off and the PMOS transistor M12 is turned on, a current signal Im from a first electric current source 10 flows to a point of contact C by way of the PMOS transistor M12. Since the NMOS transistor M24 is turned off and the NMOS transistor M23 is turned on, the current signal Im that has flown to the point of contact C flows to the NMOS transistor M23 via the resistance element R1. As a result, the current signal Im is steered to the current sinking circuit 102A by the current sourcing circuit 101A.

Fed to the output terminal 105 is a current signal Ic from a third electric current source 30 of a constant electric current source 103. As a result, the current signal Ic is fed from the output terminal 105 to the semiconductor laser circuit 120. The semiconductor laser circuit 120 outputs a High signal corresponding to the current signal Ic.

Here, it follows that a potential difference between the both ends of the semiconductor laser circuit 120 is given by Ic×Rs+V0 because the current signal Ic flows through the differential resistor Rs. Potential at a node A becomes equal to the potential difference between the both ends of the semiconductor laser circuit 120, i.e., Ic×Rs+V0. Next, potential at a node B is considered. A potential difference between the both ends of the resistance element R1 is given by R1×Im because the current signal Im flows through the resistance element R1. As a result, the potential at the node B is given by (Ic×Rs+V0)−(R1×Im).

Next, it is explained how the semiconductor laser apparatus 1 operates when it outputs a Low signal indicating data "0" from the semiconductor laser circuit 120. In this case, control signals are input to the semiconductor laser drive circuit 100A from the upper layer not illustrated such that the PMOS transistor M11 and the NMOS transistor M24 are turned on, and the PMOS transistor M12 and the NMOS transistor M23 are turned off.

In FIG. 10, there is illustrated how current signals flow when the PMOS transistor M11 and the NMOS transistor M24 are turned on and the PMOS transistor M12 and the NMOS transistor M23 are turned off. Since the PMOS transistor M11 is turned on and the PMOS transistor M12 is turned off, the current signal Im from the first electric current source 10 flows through the PMOS transistor M11.

In addition, since the NMOS transistor M23 is turned off and the NMOS transistor M24 is turned on, the second electric current source 20 pulls or sinks a current signal Im through the NMOS transistor M24. Since the PMOS transistor M14 is turned off, the second electric current source 20 pulls or sinks a portion of the current signal Ic fed from the constant electric current source 103. As a result, the current signal Im is fed to the current sinking circuit 102A from the constant current source 103.

Fed to the output terminal 105 is a current signal Ic−Im resulting from subtracting the current signal Im from the current signal Ic fed from the third electric current source 30 of the constant electric current source 103. As a result, the current signal Ic−Im is fed to the semiconductor laser circuit 120 from the output terminal 105. The semiconductor laser circuit 120 outputs a Low signal corresponding to the current signal Ic−Im.

Here, it follows that a potential difference between the both ends of the semiconductor laser circuit 120 is given by (Ic−Im)×Rs+V0 because the current signal Ic−Im flows through the differential resistor Rs. Potential at a node A and potential at a node B are each equal to the potential difference between the both ends of the semiconductor laser circuit 120, i.e., (Ic−Im)×Rs+V0.

When the semiconductor laser apparatus 1 outputs a High signal, the terminating potential is given by (Ic×Rs+V0)−(R1×Im) as described previously. If, here, R1=Rs, the terminating voltage when the semiconductor laser apparatus 1 outputs a High signal is given by (Ic×Rs+V0)−(R1×Im)=(Ic−Im)×Rs+V0 and becomes equal to the terminating potential when the semiconductor laser apparatus 1 outputs a Low signal.

The similar effect to the first embodiment can also be achieved by connecting the drain of the high blocking voltage NMOS transistor M21 to the other end of the resistance element R1 as previously described with regard to the semiconductor laser drive circuit 100A according to the present modification.

Second Embodiment

Figure 11:
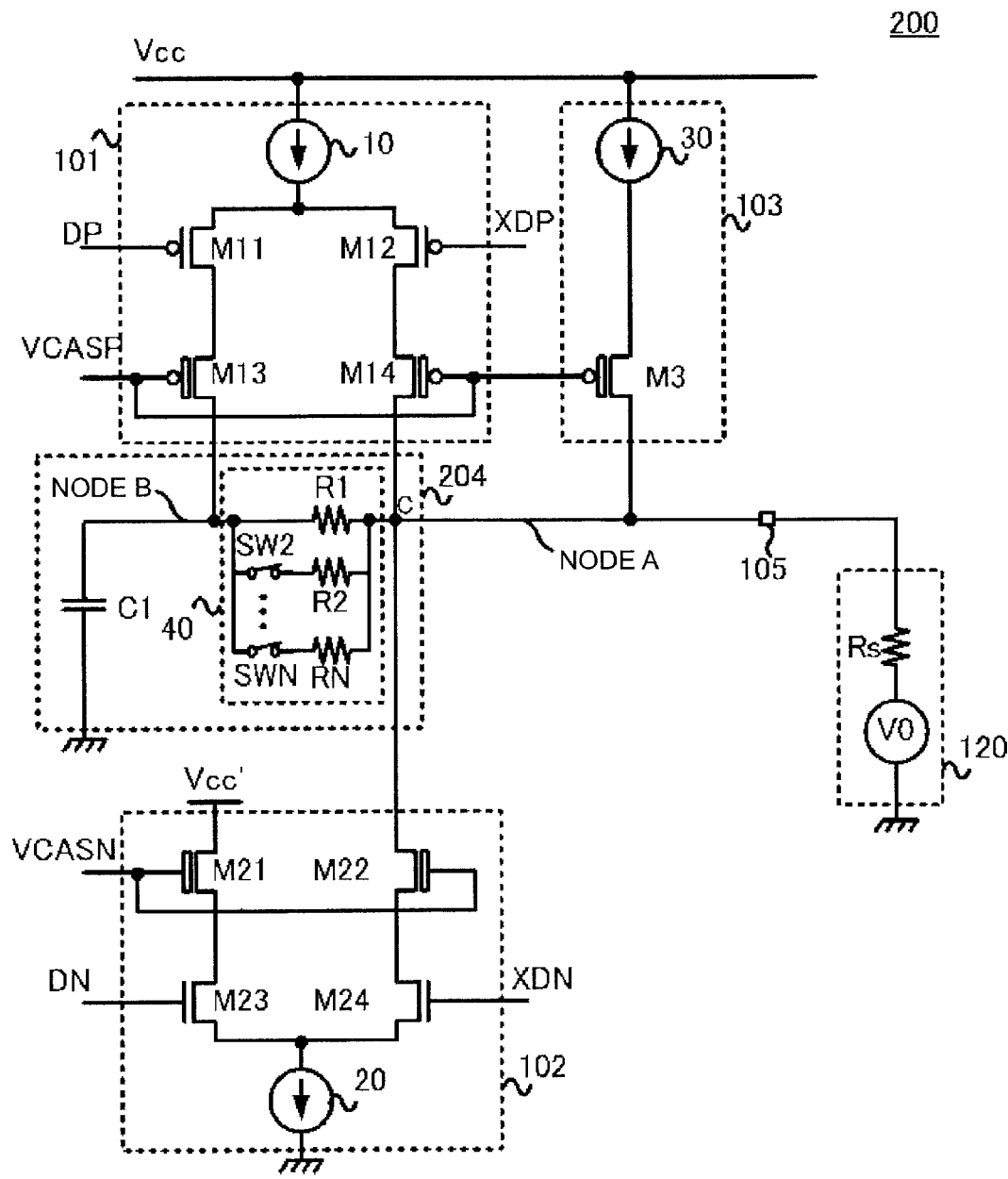
FIG. 11 is a diagram illustrating a semiconductor laser drive circuit according to a second embodiment.

Next, FIG. 11 is used to explain a semiconductor laser drive circuit 200 according to a second embodiment of the present embodiment. The semiconductor laser drive circuit 200 according to this embodiment is the same as that according to the first embodiment except that a terminating resistor 204 includes a variable resistor 40 in place of the resistance element R1. The semiconductor laser drive circuit 200 is mounted on a semiconductor laser apparatus 1 in place of the semiconductor laser drive circuit 100.

As shown in FIG. 11, the terminating resistor 204 has the variable resistor 40 connected at one end to an output terminal 105 and connected at the other end to a drain of a high blocking voltage PMOS transistor M13. The variable resistor 40 according to this embodiment has a plurality (N number) of resistance elements R1, R2 . . . RN, and a plurality of switches SW2 to SWN connected to the plurality of resistance elements R2 to RN excluding the resistance element R1 from among the given N number of resistance elements. In concrete terms, the resistance element Rk and the switch SWk (k is an integer in the range of 2 to N) are connected in series. This series connection of the resistance element Rk and switch SWk is called a resistance circuit. The resistance element R1 and a plurality of resistance circuits are connected in parallel. Selecting on or off states of the switches SW2 to SWN can change the resistance of the variable resistor 40.

The differential resistor Rs of the semiconductor laser circuit 120 has variability in resistance caused at the time of manufacture. As a result, there are cases where even if the resistance element R1 of the terminating resistor 104 is designed to have the same resistance as the differential resistor Rs (R1=Rs), they do not actually have the same resistance. So, the terminating resistor 104 uses the variable resistor 40 in place of the resistance element R1 according to this embodiment such that the resistance of the variable resistor 40 may be determined according to variability in resistance of the differential resistor Rs caused at the time of manufacture.

Among various ways to determine the resistance of the variable resistor 40, there is a way to measure values of potential at a node B with, for example, a measuring part not illustrated, one value of which is obtained when a High signal is output and the other value of which is obtained when a Low signal is output, and then control the switches SW2 to SWN so as to minimize a difference between these measured values. In concrete terms, the semiconductor laser drive circuit 200 generates a current signal Im+Ic and a current signal Ic while the measuring part selects one of combinations of on and off states of the switches SW2 to SWN. The measuring part measures a value of potential at the node B when the semiconductor laser drive circuit 200 generates the current signal Im+Ic and a value of potential at the node B when the semiconductor laser drive circuit 200 generates the current signal Ic. The measuring part continues this process until the appropriate combination of on and off states of the switches SW2 to SWN is found so as to hold the potential at the node B nearly constant. The resistance of the variable resistor 40 may be determined at the timing, for example, when the semiconductor laser apparatus 1 is started up or shipped.

The semiconductor laser drive circuit 200 according to this embodiment makes it possible to hold the terminating potential nearly constant with the variable resistor 40 in the terminating resistor 204 while achieving the similar effect to the first embodiment as described previously even if there is variability in resistance of the differential resistor Rs of the semiconductor laser circuit 120. This allows the semiconductor laser drive circuit 200 to improve levels of jitter by suppressing variations in DC level regardless of variability of the semiconductor laser circuit 120 caused at the time of manufacture.

In addition, according to this embodiment, the variable resistor 40 is used in place of the resistance element R1 of the semiconductor laser drive circuit 100 shown in the first embodiment, but the variable resistor 40 may be used in place of the resistance element R1 of the semiconductor laser drive circuit 100A shown in Modification 1.

Third Embodiment

Figure 12:
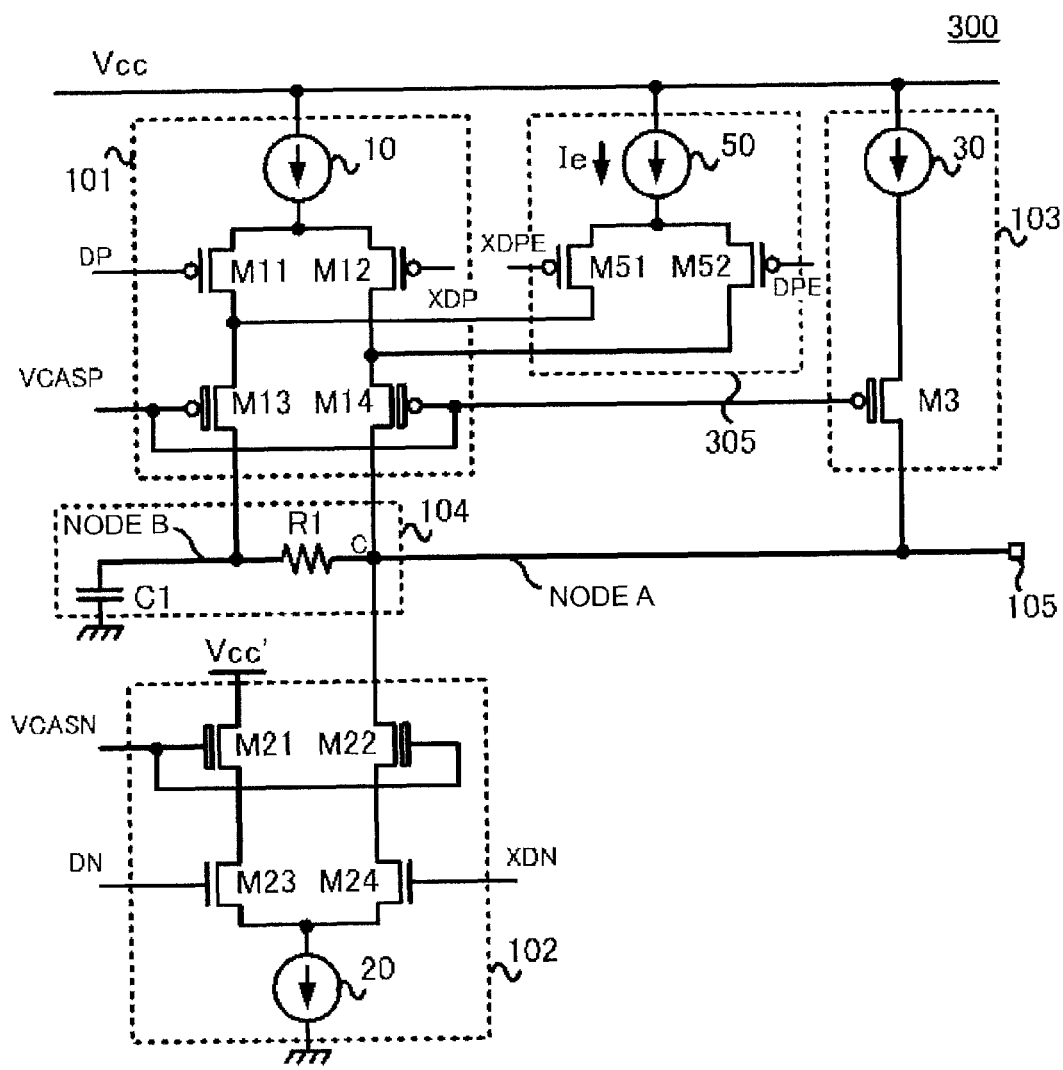
FIG. 12 is a diagram illustrating a semiconductor laser drive circuit according to a third embodiment.

Next, FIG. 12 is used to explain a semiconductor laser drive circuit 300 according to a third embodiment. The semiconductor laser drive circuit 300 according to this embodiment is the same as that according to the first embodiment except the provision of a de-emphasis circuit 305. The semiconductor laser drive circuit 300 is mounted on the semiconductor laser apparatus 1 in place of the semiconductor laser drive circuit 100.

As shown in FIG. 12, the de-emphasis circuit 305 has first to third terminals. The first terminal is connected to a first electric power potential (Vcc in FIG. 12) and the second and third terminals are connected to a current sourcing circuit 101.

The de-emphasis circuit 305 includes an electric current source 50, which is connected at one end to Vcc and generates a current signal Ie, and PMOS transistors M51 and M52. The PMOS transistor M51 is connected at its source to the other end of the electric current source 50 and connected at its drain to a drain of a PMOS transistor M11. Input to a gate of the PMOS transistor 51 is a control signal XDPE from an upper layer not illustrated.

The PMOS transistor M52 is connected at its source to the other end of the electric current source 50 and connected at its drain to a drain of a PMOS transistor M12. Input to a gate of the PMOS transistor M52 is a control signal DPE from the upper layer not illustrated.

The one end of the electric current source 50 corresponds to a first terminal of the de-emphasis circuit 305, and the drain of the PMOS transistor M51 corresponds to a second terminal of the de-emphasis circuit 305. In addition, the drain of the PMOS transistor M52 corresponds to a third terminal of the de-emphasis circuit 305.

Figure 13:
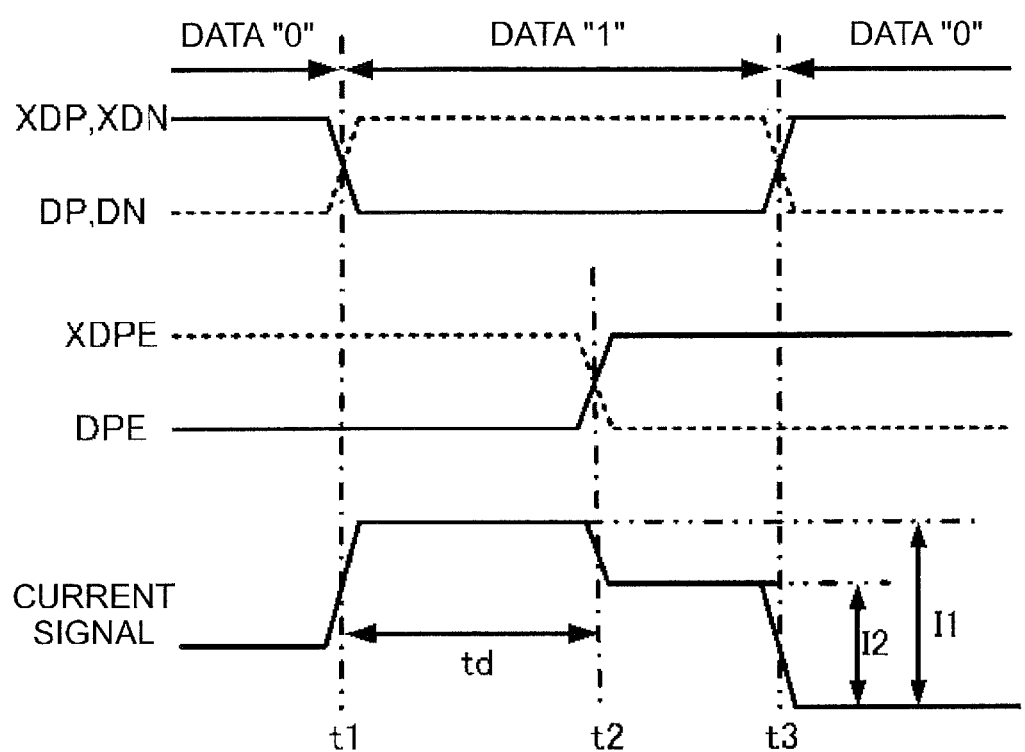
FIG. 13 is a timing chart illustrating operation of the semiconductor laser drive circuit according to the third embodiment.

Next, FIG. 13 is used to explain operation of the semiconductor laser drive circuit 300 according to the present invention. FIG. 13 is a timing chart of the control signals DP, XDP, DN, XDN, DPE, XDPE and a current signal generated by the semiconductor laser drive circuit 300.

As shown in FIG. 13, in the case that the semiconductor laser apparatus 1 outputs a Low signal representing data "0", the control signal XDP is High, turning off the PMOS transistor M12, and the control signal XDN is High, turning on the NMOS transistor M24. The control signal DP is Low, turning on the PMOS transistor M11, and the control signal DN is Low, turning off the NMOS transistor M23.

In addition, the control signal DPE is Low and the control signal XDPE is High. This turns on the PMOS transistor M52 and turns off the PMOS transistor M51. Via the PMOS transistor M52, the current signal Ie from the electric current source 50 is input to the high blocking voltage PMOS transistor M14. Current signals Ie and Im are in antiphase, and the current signal Ie is low in amplitude as compared to the current signal Im.

Next, at moment t1, it is assumed that the semiconductor laser apparatus 1 changes its output data from "0" to "1". At this moment, the control signals XDP and XDN switches to Low from High. This turns on the PMOS transistor M12 and turns off the NMOS transistor M24. The control signal DP switches to High from Low, turning off the PMOS transistor M11, and the control signal DN switches to High from Low, turning on the NMOS transistor M23.

At moment t1, the control signals DPE and XDPE do not switch. As a result, before moment t1, the high blocking voltage PMOS transistor M14 receives a current signal Ie from the electric current source 50, and at and after moment t1, the high blocking voltage PMOS transistor M14 receives a current signal Im from the first electric current source 10 in addition to the current signal Ie. In this way, before the output data of the semiconductor laser apparatus 1 switches, the current signal Ie is input to the high blocking voltage PMOS transistor M14, with the result that at timing (moment t1) the output data switches, a high amplitude current signal is allowed to flow through the high blocking voltage PMOS transistor M14. This increases the amplitude of the current signal, which is an output electric current of the semiconductor laser drive circuit 300 at moment t1, peaking the current signal.

At moment t2 upon elapse of a predetermined duration td from moment t1, the semiconductor laser apparatus 1 turns on the PMOS transistor M51 and turns off the PMOS transistor M52. In concrete terms, the control signal XDPE switches to Low, and the control signal DPE switches to High. This steers the current signal Ie to the high blocking voltage PMOS transistor M13, so no current signal remains flowing through the high blocking voltage PMOS transistor M14, decreasing the flow rate of the current signal from the semiconductor laser drive circuit 300.

Next, at moment t3, it is assumed that the semiconductor laser apparatus 1 changes its output data from "1" to "0". At this moment, the control signals XDP and XDN switch to High from Low. This turns off the PMOS transistor M12 and turns on the NMOS transistor M24. The control signals DP and DN switch to Low from High, turning on the PMOS transistor M11, turning off the NMOS transistor M23.

As described above, the flow rate of the current signal from the semiconductor laser drive circuit 300 is decreased by turning on the PMOS transistor M51 and turning off the PMOS transistor M52 at moment t2. A difference 12 between the amplitudes of current signal before and after moment t3 when the output data switches to "0" from "1" is less than a difference 11 between the amplitude of current signal before moment t2 and the amplitude of current signal after moment t3. This shortens transition duration indicative of the total time of transition to a predetermined amplitude of current signal after moment t3 because the amplitude of current signal is decreased beforehand at moment t2.

Gain-bandwidth product characteristic ($f_t$ characteristic) of high blocking voltage transistors is poor in general as compared to that of low blocking voltage transistors, impeding high-speed drive of semiconductor laser drive circuits. According to this embodiment, the de-emphasis circuit 305 and the current sourcing circuit 101 are connected in parallel, and the de-emphasis circuit 305 provides an electric current that is in antiphase with the current signal Im to the current sourcing circuit 101 upon elapse of predetermined duration td after destination to which the current sourcing circuit 101 steers the current signal Im has switched, that is, the output data has switched, allowing adjustment of the flow rate of the current signal that is output by the semiconductor laser drive circuit 300. This allows high-speed drive of the semiconductor laser drive circuit 300.

According to this embodiment, the current signal Ie is allowed to flow through the semiconductor laser drive circuit 300 by the electric current source 50 and it is desirable to adjust the current signal Ic created by the constant electric current source 103 in consideration of the current signal Ie. According to this embodiment, the flow rate of current signal Ic created by the constant electric current source 103 is decreased by a predetermined amount that is determined depending on the flow rate of the current signal Ie.

According to this embodiment, the high blocking voltage PMOS transistors M13 and M14 are connected to the de-emphasis circuit 305, peaking sources of the high blocking voltage PMOS transistors M13 and M14. This is because the current drive capability of the PMOS transistors is low as compared to that of the NMOS transistors. Drive speed of the whole semiconductor laser drive circuit 300 can be improved by peaking sources of the high blocking voltage PMOS transistors M13 and M14 because the drive speed of the high blocking voltage PMOS transistors M13 and M14 greatly influences the drive speed of the whole semiconductor laser drive circuit 300. Similarly to the high blocking voltage PMOS transistors M13 and M14, however, it is possible to peak sources of the high blocking voltage NMOS transistors M21 and M22.

This embodiment is described on the case that the de-emphasis circuit 305 is provided in the semiconductor laser drive circuit 100 according to the first embodiment, but the de-emphasis circuit 305 may be provided in the semiconductor laser drive circuit 100A according to Modification 1 or the semiconductor laser drive circuit 200 according to the second embodiment.

The present disclosure contains subject matter related to that disclosed in Japanese Priority Patent Application JP 2011-111159 filed in the Japan Patent Office on May 18, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor laser drive circuit controlling a semiconductor laser diode connected to an output terminal by providing a drive electric current to the semiconductor laser diode, comprising:
    a constant electric current source configured to provide an electric current to the output terminal, the constant electric current source being connected at one end to a first electric power terminal and connected at the other end to the output terminal;
    a current sinking circuit connected at one end to the output terminal and connected at the other end to a second electric power terminal;
    a current sourcing circuit configured to provide a predetermined electric current to one of the output terminal and the current sinking circuit, the current sourcing circuit being connected at one end to the first electric power terminal and connected at the other end to the output terminal; and
    a terminating resistor having a resistance component equal to a resistance component of the semiconductor laser diode, the terminating resistor being connected at one end to the one end of the circuit sinking circuit and connected at the other end to the other end of the current sourcing circuit.

2. The semiconductor laser drive circuit according to claim 1,
    wherein the current sourcing circuit includes
        a first transistor configured to provide the predetermined electric current to the output terminal, and
        a second transistor configured to provide the predetermined electric current to the circuit sinking circuit, and
    wherein the first and second transistors operate complementarily.

3. The semiconductor laser drive circuit according to claim 2, wherein the terminating resistor includes
    a resistance element connected at one end to a source of the first transistor and connected at the other end to a source of the second transistor, and
    a capacitance element connected at one end to the other end of the resistance element and connected at the other end to the second electric power terminal.

4. The semiconductor laser drive circuit according to claim 3,
    wherein the terminating resistor includes
        a variable resistor having a plurality of resistance circuits, each having a second resistance element and a switch connected in series with the second resistance element, connected in parallel with the resistance element.

5. The semiconductor laser drive circuit according to claim 1, further comprising
    an electric current source connected in parallel with the current sourcing circuit and configured to provide an electric current that is in antiphase with the predetermined electric current to the current sourcing circuit upon elapse of a predetermined duration after destination to which the current sourcing circuit provides the predetermined electric current has switched.

6. A semiconductor laser drive circuit controlling a semiconductor laser diode connected to an output terminal by providing a drive electric current to the semiconductor laser diode, comprising:
    a constant electric current source configured to provide an electric current to the output terminal, the constant electric current source being connected at one end to a first electric power terminal and connected at the other end to the output terminal;
    a current sourcing circuit connected at one end to the first electric power terminal and connected at the other end to the output terminal;
    a current sinking circuit configured to sink an electric current provided from one of the constant electric constant source and the current sourcing circuit, the current sinking circuit being connected at one end to the output terminal and connected at the other end to a second electric power terminal; and
    a terminating resistor having a resistance component equal to a resistance component of the semiconductor laser diode, the terminating resistor being connected at one end to the one end of the circuit sinking circuit and connected at the other end to the other end of the current sourcing circuit.

7. A semiconductor laser apparatus, comprising:
    a semiconductor laser diode; and
    a semiconductor laser drive circuit controlling the semiconductor laser diode connected to an output terminal by providing a drive electric current to the semiconductor laser diode,
    wherein the semiconductor laser drive circuit includes
        a constant electric current source configured to provide an electric current to the output terminal, the constant electric current source being connected at one end to a first electric power terminal and connected at the other end to the output terminal,
        a current sinking circuit connected at one end to the output terminal and connected at the other end to a second electric power terminal,
        a current sourcing circuit configured to provide a predetermined electric current to one of the output terminal and the current sinking circuit, the current sourcing circuit being connected at one end to the first electric power terminal and connected at the other end to the output terminal, and
        a terminating resistor having a resistance component equal to a resistance component of the semiconductor laser diode, the terminating resistor being connected at one end to the one end of the circuit sinking circuit and connected at the other end to the other end of the current sourcing circuit.

* * * * *